METHOD OF MAKING MULTILAYER CIRCUITS

Filed April 27, 1962 3 Sheets-Sheet 1

INVENTOR.
HAROLD W. STETSON
BY
W.S. Hill
AGENT

INVENTOR.
HAROLD W. STETSON
BY
W.S. Hill
AGENT

June 22, 1965 H. W. STETSON 3,189,978

METHOD OF MAKING MULTILAYER CIRCUITS

Filed April 27, 1962 3 Sheets-Sheet 3

INVENTOR
HAROLD W. STETSON
BY
W.S. Hill
AGENT

United States Patent Office 3,189,978
Patented June 22, 1965

3,189,978
METHOD OF MAKING MULTILAYER CIRCUITS

Harold W. Stetson, Croydon, Pa., assignor to Radio Corporation of America, a corporation of Delaware Filed Apr. 27, 1962, Ser. No. 190,664
5 Claims. (Cl. 29—155.5)

This invention relates to improved multilayer circuits and methods of manufacture. More particularly, the invention relates to multilayer circuits comprising a ceramic body and electrical conductors within the body disposed in different layers, having interconnecting means disposed entirely within the body. The ceramic body and the electrical conductors are sintered to form a monolithic structure.

Various types of multilayer circuits have previously been proposed. In general, these have comprised individual sheets of a dielectric material with electrical conductors arranged in some desired pattern on the surface of each of the sheets. Provision for interconnecting parts of the different layers is usually made by punching holes at desired locations in the dielectric sheet, placing wires in these holes and filling the remainder of the holes with solder. The dielectric sheets may be composed of such materials as ceramics including glass, synthetic resin plastics or the like. The circuits themselves may contain both active and passive components mounted thereon and, where protection from the ambient is necessary, the entire circuit assembly must be sealed as by potting in a synthetic resin.

Where extreme miniaturization of the components is desired, the above-mentioned types of previously used multilayer circuits have not been satisfactory since adequate spacing must be allowed between layers and the potting materials themselves take up appreciable space.

One object of the present invention is to provide improved multilayer circuits having hermetic structure without requiring separate potting materials.

Another object of the invention is to provide improved multilayer circuits adapted to extreme miniaturization.

Another object of the invention is to provide an improved method of making multilayer electronic circuits utilizing ceramic materials as the dielectric.

A further object of the invention is to provide miniaturized multilayer circuits having a relatively high degree of durability.

In general, a feature of the present invention comprises a method of manufacturing multilayer electronic circuits by first preparing a plurality of dry thin films each comprising finely divided ceramic particles and a heat volatile binder therefor, forming electrical conductors as thin metallic layers upon selected surface areas of at least two of these films, forming holes penetrating both the films and associated conductors at desired locations, filling the holes with a paste including metallic particles, assembling the films in a stack such that the conductors and holes are in desired relationship, and then heating the stack for a time and at a temperature sufficient to volatilize the binder and sinter the ceramic particles and the metals into a monolithic structure.

Another feature of the invention relates to circuits made by the improved process.

The invention is described in more detail in the following specification and in the drawing of which:

*Example I*

A preferred method of making a circuit in accordance with the present invention will now be given. A dielectric sheet or film is first prepared with the ingredients in the following proportions by weight:

100 grams powdered ceramic dielectric composition having the molar ratio and composition: 1.0 mol barium carbonate and 5.0 mol titanium dioxide.

15 grams heat-volatile binder, such as a vinyl chloride-acetate copolymer, for example Vinylite VYNS, marketed by Union Carbide Chemicals Corp., New York, N.Y.

85 grams solvent such as methyl ethyl ketone, 1 gram plasticizer for the binder, such as butyl benzyl phthalate 0.5 gram deflocculant for the ceramic dielectric powder.

The above formulation is agitated in a paint shaker for about ten minutes. The viscosity is checked and adjusted to the desired value. The mixture is then transferred to a ball mill and milled until it has acquired an average particle size of the solids of about 3.5 microns. A 2-lb. batch in a 2-qt. ball mill requires about 12 hours of milling. When milling is completed, the milled batch is adjusted to have a specific gravity of about 2.3 and a viscosity of about 1000 centipoises. A film is now produced upon a suitable support such as a smooth glass plate. A quantity of the milled formulation is poured on the support. A steel doctor blade is passed across the surface of the plate. Using ordinary hand pressure, the doctor blade leaves a film of milled formulation on the support. The film has a thickness of about 1 mil. Excess film formulation is removed and the film is dried in air. Drying may be facilitated by the application of heat and circulation of air over the film. It has been found convenient to dry the film in an oven at 100° C. for about ten minutes. The resulting dry film is flexible and strippable. It may be of any convenient size with sufficient area to print a plurality of circuit portions thereon as illustrated in FIGURE 1 by the film or sheet 2.

Figure 1:
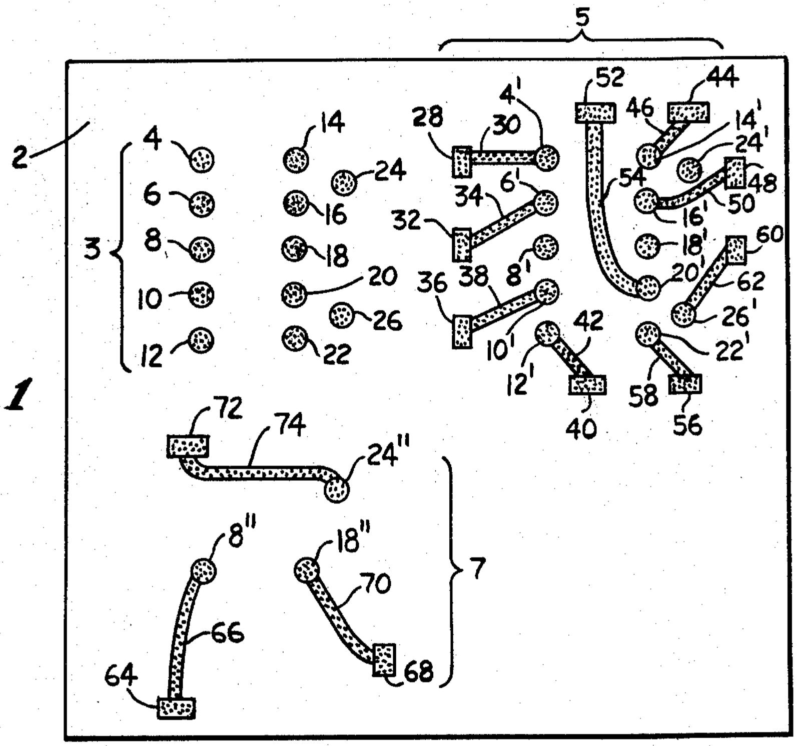
FIGURE 1 is a top view of an unfired ceramic film having a plurality of patterns of metallized areas deposited thereon and illustrating one step in the process of the present invention.

The next step in the process is to deposit a pattern of metallized areas upon the upper surface of the film 2 as shown in FIGURE 1. The pattern may comprise a plurality of separate groups of metallized areas, which are to become different layers of the completed circuit, such as the areas designated generally as 3, 5, and 7 of FIGURE 1. The pattern area 3 comprises 12 metallized dots which may serve as circuit connections in the completed circuit. These dots are numbered 4, 6, 8, 10, 12, 14, 16, 18, 20, 22, 24 and 26. The pattern area 5 includes similar dots numbered 4', 6', 8', 10', 12', 14', 16', 18', 20', 22', 24', and 26'. The metal dot 4' is connected to an edge connection area 28 by a metal connector 30. The dot 6' is connected to an edge connection area 32 by a connector 34. The dot 10' is connected to an edge connection area 36 by a connector 38. The dot 12' is connected to an edge connection area 40 by a connector 42. The dot 14' is connected to an edge connection area 44 by a connector 46. The dot 16' is connected to an edge connection area 48 by a connector 50. The dot 20' is connected to an edge connection area 52 by a connector 54. The dot 22' is connected to an edge connection area 60 by a connector 62. The pattern area 7, which is to be a third layer of the completed circuit, comprises three dots 8'', 18'', and 24'' and asociated connectors. The dot 8'' is connected to an edge connection area 64 by a connector 66. The dot 18'' is connected to an edge connection area 68 by a connector 70. The dot 24'' is connected to an edge connection area 72 by a connector 74.

These metallized areas are deposited on the film by first preparing a quantity of metallizing paste which may comprise a composition such as Du Pont Palladium Paste No. 7665. This paste is composed of 58% by weight palladium having a particle size between 1 and 10 microns, suspended in a binder of methyl cellulose and a solvent of butyl carbitol acetate. A quantity of this paste is adjusted to have the proper viscosity and is placed on a 200 mesh silk screen which is filled except in the pattern of the desired areas to be metallized. The paste is squeegeed through the screen in the desired areas, producing the metallized portions above described. The coated areas are dried in air, preferably in a 100° C. oven for about ten minutes. The dried coated areas are about 0.5 mil thick.

Following the drying operation, the coated film 2 is stripped from its support. At this point, the film is flexible and may be easily cut to any desired shape or have portions punched therefrom.

Figure 2:
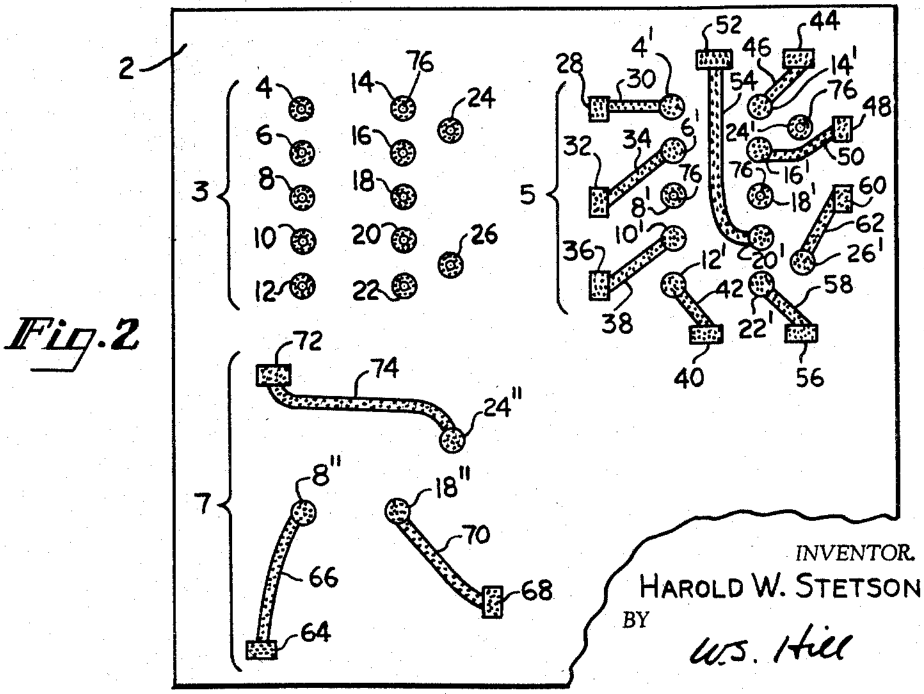
FIGURE 2 is a view similar to FIGURE 1 illustrating a second step in the process of the present invention.

Next step in the method is to punch holes at desired locations through the metallized areas. As shown in FIGURE 2, holes indicated generally as 76 are punched through all of the dots in the pattern area 3 and through the dots 8', 18', and 24' of pattern area 5.

Figure 3:
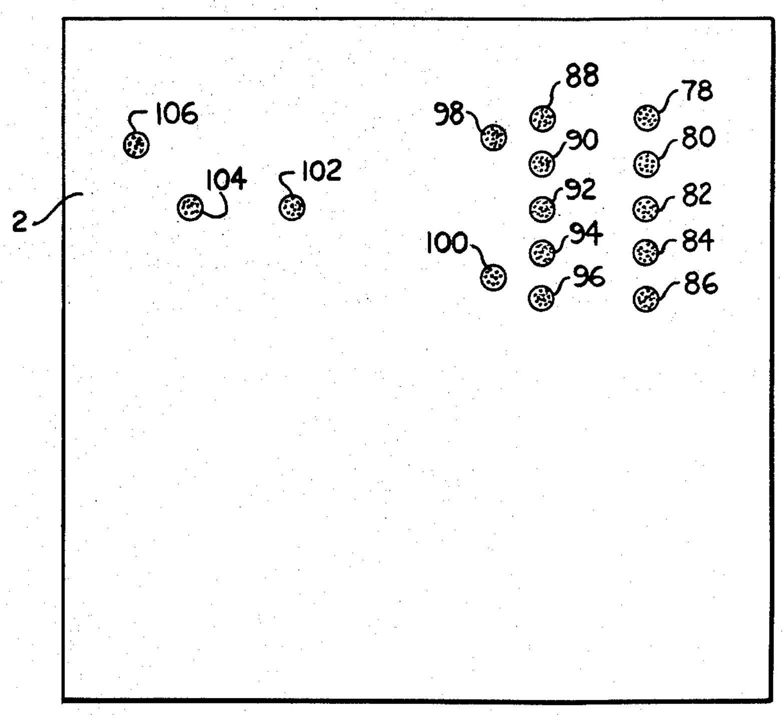
FIGURE 3 is a bottom view of the sheet of FIGURE 2 illustrating a third step in the process of the invention.

The sheet 2 is now turned over so that its under side is uppermost and, as indicated in FIGURE 3, metal paste is deposited over all of the holes which are punched in the sheet during the previous step and some of the paste is forced through the holes so that it appears on the other side of the sheet. Suction may be used to aid in drawing the paste through the holes. Thus the holes in the dots numbered 4 to 26 have been filled with metallizing paste and quantities of the paste deposited around them on the reverse side of the sheet designated by the numbers 78, 80, 82, 84, 86, 88, 90, 92, 94, 96, 98, and 100. The holes punched through the dots 8', 18', and 24' have had similar quantities of metal paste forced through them and areas of metal paste 102, 104, and 106 have been deposited on the reverse side of the sheet.

Figure 4:
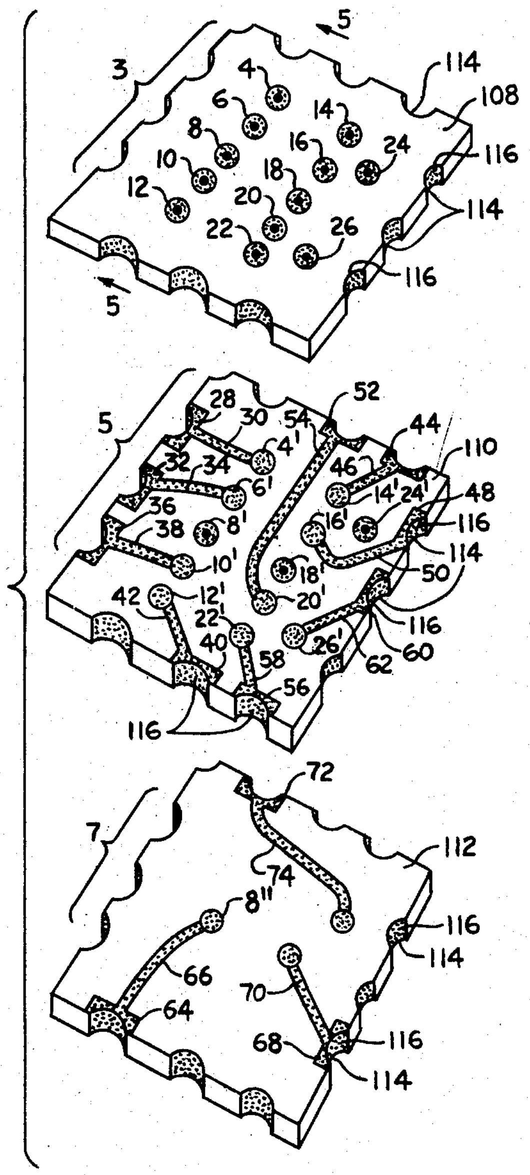
FIGURE 4 is an exploded perspective view of separated parts of the film of FIGURES 1, 2 and 3 illustrating a fourth step in the process of the invention.

The sheet 2 is now turned over again so that it has its original position and the circuit layers are blanked out so that they form individual wafers. As shown in FIGURE 4, the pattern area 3 is isolated on wafer 108; the pattern area 5 is on wafer 110, and the pattern area 7 is on wafer 112. In the blanking process, each wafer holding one of the circuit portions is provided with 12 curved notches designated generally 114, and each of the notches is given a coating of metallic paste 116.

Figure 5:
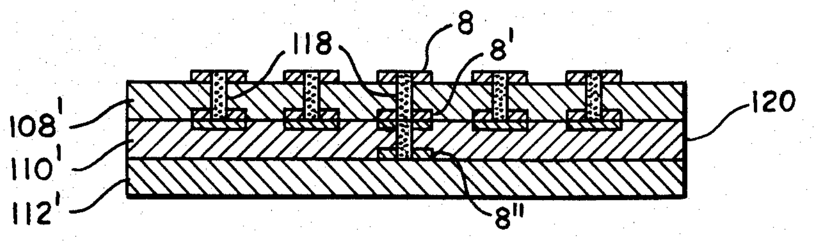
FIGURE 5 is a section view taken along the line 5—5 of FIGURE 4.

The circuit portions are now ready to be formed into an integrated whole. This is done by stacking the wafers one on top of the other as indicated in FIGURE 4 and FIGURE 5. Corresponding parts of each layer are in registry. Thus, the dots 8, 8' and 8'' are all in registry one over the other, as are the dots 18, 18' and 18'' and the dots 24, 24' and 24''. The other dots having corresponding numbers are also in registry. The stack of wafers 108, 110 and 112 is placed between platens of a press. The platens are heated to a temperature of about 125° C. The platens are used to apply pressure of about 1000 lbs. per square inch to the stack for about 5 minutes. During the pressing step, the films in the stack are bonded together by the action of the heat and pressure to form a monolithic laminated structure. The pressure is removed and the laminate is ready for firing. The laminate is now fired to produce a sintered structure. This is done by placing the laminate on a refractory such as a zirconia setter, the setter placed in a furnace at 200° C. for about thirty minutes after which the temperature is increased at the rate of 50° C. each fifteen minutes up to 400° C. and held there until the volatile matter has been removed from the laminate, typically fifteen minutes. Then, the temperature is raised rapidly to about 1250° C. and held there for about two hours. During this period, the constituents of the ceramic dielectric composition react to form particles of ceramic dielectric. Also the particles of metal and ceramic sinter into a unitary multilayer monolithic body 120. The layers, although now fused together, have been designated in FIGURE 5 as 108', 110' and 112'. The furnace is cooled to room temperature and the monolithic body removed from the furnace.

As shown in FIGURE 5, some of the metal dots in the different circuit layer portions are now connected by leads 118 formed of metal particles sintered to each other and to the fired ceramic 120. For example, the dots 8, 8' and 8'' are so connected. These connections enable crossovers to be made with the circuit conductors without providing any insulation other than the ceramic matrix. This is both a convenience in manufacturing and an advantage in miniaturization.

The following is another preferred example of a method of making a multilayer circuit in accordance with the present invention.

*Example II*

A film formulation is prepared with the following weight proportions:

90 parts powdered alumina (325 mesh)
4 parts ball clay
6 parts talc (magnesium silicate)
13 parts heat-volatile binder, such as vinyl chloride-acetate copolymer, for example Vinylite VYNS, marketed by Union Carbide Chemicals Corp., New York, N.Y.
85 parts solvent such as methyl ethyl ketone
2 parts placticizer for the binder.

The mixture is transferred to a suitable size ball mill and milled to acquire an average particle size of about 2 to 3 microns. A 2-lb. batch in a 2-qt. capacity ball mill requires about 8 to 12 hours of milling. When milling is completed, the milled batch is adjusted by additional methyl ethyl ketone to have a viscosity of about 600 to 1000 as measured on a Brookfield RBF viscosimeter with a No. 3 spindle rotating at 20 r.p.m.

A quantity of the above film formulation is spread upon a smooth glass plate. The formulation may be deposited by spraying, screening, or doctor blading. In this example, the film is doctor bladed to a thickness of about 1 mil, and is then dried in air. Drying may be accelerated by heating the substrate and film at 100° C. for about ten minutes. After drying, the film is quite flexible and can be readily stripped from the substrate at a subsequent step in the manufacturing of the circuit. As an alternative procedure to that of Example I, holes may next be punched through the film at desired locations and metallized areas may then be deposited including the areas around the holes and also through the holes. Metallized areas, as shown in FIGURES 1, 2 and 3, or some other desired configuration, are screened on the upper surface of the film. The metallizing formulation comprises a mixture of finely divided molybdenum and finely divided manganese having a particle size of ½ to 3 microns, dispersed in a slow-drying organic vehicle such as ethyl cellulose or nitro cellulose, or the like, dissolved in an organic solvent. A suitable composition consists of 63 weight percent molybdenum powder, 15 weight percent manganese powder, 20 weight percent ethyl cellulose dissolved in butyl carbitol acetate, and 2 weight percent titanium hydride. The metallized films are dried as in the previous example. Next, instead of first blanking out the separate wafer portions as in Example I, a plurality of large sheets may be stacked and bonded with the proper circuit portions in the different layers in registry. To do this, it is necessary to print only one type of circuit pattern on each large sheet rather than the variety of patterns shown in FIGURES 1 and 2. After the stacking and bonding operation, stacks of the smaller wafer laminates are blanked out of the larger laminate and the edge notches 114 are provided with metal coating 116 so that external connections can be soldered thereto. This alternate method has the advantages of more efficient mass production both in the assembling and blanking steps as well as in the step of metallizing the notches.

The composite wafer is now fired in a reducing atmosphere at a temperature high enough to vitrify the ceramic. Firing is accomplished at 1550° C. in wet forming gas (9 volumes nitrogen and 1 volume hydrogen) for about one hour. During this step, the binder is volatilized and oxidized, there being enough moisture in the forming gas to provide a slightly oxidizing atmosphere. During the firing step, the individual layers of the wafer are fused into a single monolithic structure as in the previous example.

Since the metallized portions which are exposed at the surfaces of the monolithic structure, as thus made, are non-solderable, it is advantageous to electroplate the metallized portions with a layer of nickel 0.2 mil thick and superimpose a similar thickness of copper over the nickel. The wafer is then heated in hydrogen at about 850° C. for about ten minutes to sinter the nickel-copper plating to the metallized regions of the wafer. Next, the wafer is dipped into molten solder, which may, for example, consist of 60 tin-37 lead-3 silver, so that the exposed metallized regions are heavily coated with solder.

The composition of the ceramic which is used in making the multilayered circuits of the invention is not particularly critical. Any one of a large number of different compositions may be utilized. Other examples are ceramics composed of 1 mol lathanium oxide and 2 mols titanium dioxide; reacted barium titanate; and ceramics composed of combinations of barium titanate, calcium titanate, strontium titanate, calcium zirconate, magnesium zirconate, and cerium dioxide. It is also possible to use powdered devitrifiable glasses.

The binder should be of the type which completely volatilizes when heated. The volatilization may be by evaporation, depolymerization, or oxidation. The binder in the ceramic film should be compatible with binder in the metallizing formulation and both should be of the type which bond together during the laminating step. Solvents are used with the binder when the films are deposited by spraying or silk screening, but the films may also be produced by extrusion, in which case little or no solvent is required. Plasticizers and deflocculants are optional in the composition.

In general, the weight ratio of ceramic dielectric composition to binder in the film formulation may vary between 90–10 and 65–35. Preferably, the ratio is between 88–12 and 82–18. In general, the lowest proportion of binder should be used consistent with adequate bonding during the lamination step. It has been found that formulations with finer particle size require a higher proportion of the binder.

The thickness of the unfired ceramic film may be varied between about 0.5 and 20 mils. Upon drying and firing, the thickness is reduced by shrinkage by an amount which depends upon the particular film formulation. The film formulation of Example I shrinks about 20% during the drying and firing.

Various metallizing compositions may be used both for making the metallized areas on the surface of the film and for making the interlayer connections. The type of metallizing composition use, however, must be compatible with the type of ceramic composition used. For example, it will be noted that the metallizing paste used in Example I can be properly sintered in an oxidizing atmosphere which is used to fire the ceramic. The metallized composition of the second example is properly sintered in a reducing atmosphere such as is used to fire the ceramic composition of this example. The metallizing formulation should have a maturing temperature compatible with the sintering temperature of the ceramic dielectric composition. Metal compounds which decompose to free metal upon heating in the atmosphere which is used to fire the ceramic may be used instead of the metals themselves. For making the metallized areas (but not filling the holes in the film) metals may be deposited by any convenient process such as spraying through a mask or evaporating without use of binder.

Figure 6:
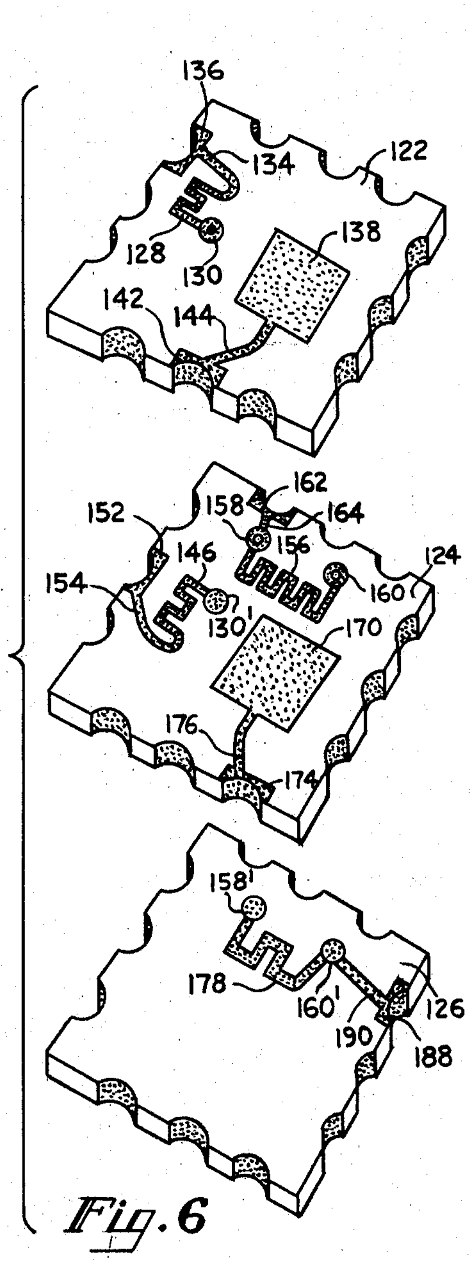
FIGURE 6 is an exploded view like that of FIGURE 4 illustrating how the method of the invention may be employed in circuit manufacture.

An example of how circuit components may be built into the product is illustrated in FIGURE 6 but this is only indicative of a vast number of variations possible. In the figure are shown three blanked out wafers 122, 124 and 126 positioned in the order in which they are to be stacked and bonded. Wafer 122 has been provided with a metallized pattern including a resistor 128 connected at one of its ends to a metallized dot 130. The dot 130 is provided with a hole filled with metallizing composition. The other end of the resistor 128 is connected to metallized edge area 136 by connector 134. Wafer 122 also carries one electrode 138 of a capacitor. The electrode 138 is connected to a metallized edge area 142 by a connector 144.

The wafer 124 has a first resistor 146 connected at one of its ends to a metallized dot 130'. The other end of resistor 146 is connected to metallized edge area 152 by connector 154. Wafer 124 also has a second resistor 156 connected at its ends to dots 158 and 160. Both of these dots are provided with holes filled with metallizing composition. The dot 158 is connected to edge area 162 by connector 164.

Wafer 124 also carries a capacitor electrode 170 connected to edge area 174 by connector 176.

The third wafer 126 carries a resistor 178 which is connected at its ends to dots 158' and 160'. The dot 160' is connected to edge area 188 by connector 190.

The three wafers 122, 124 and 126 are stacked and bonded in registry so that corresponding dots, such as 130 and 130', 158 and 158', 160 and 160' are superposed. Capacitor electrodes 138 and 170 must also be superposed.

The stack of wafers is fired, as in the previous example. It will be noted that resistors 128 and 146 have been connected in series and that resistors 156 and 178 have been connected in parallel. Electrodes 138 and 170, together with the fired ceramic sheet between them, constitute a ceramic dielectric capacitor.

The sizes of the metallized dots and widths of connectors with relation to area of wafer surface have been exaggerated in the drawing for ease of illustration. Actually, more components and more intricate patterns of connectors can be accommodated on a single wafer having an edge dimension, when fired, of about ⅝ inch.

Conventional solid state circuit elements such as small size transistors and diodes can be accommodated in a stack of wafers by providing a laminate assembly with a recess in which to mount the circuit elements.

What is claimed is:

1. A method of manufacturing an electronic circuit comprising a monolithic ceramic body and interconnected electrical conductors bonded to said ceramic, portions of said conductors being disposed in different layers, said method comprising preparing a plurality of dry thin films each comprising finely divided ceramic particles and a heat volatile binder therefor, forming said conductors as thin metallic layers upon selected surface areas of at least two of said films, forming holes penetrating said last mentioned films and said conductors at desired locations, filling said holes with a paste including metallic particles in a heat volatile binder, assembling said films in a stack such that said conductors and holes are in a desired relationship, and then heating said stack for a time and at a temperature sufficient to volatilize said binders and sinter said ceramic particles and said metals into a monolithic structure.

2. A method of manufacturing an electronic circuit comprising a monolithic ceramic body and interconnected electrical conductors bonded to said ceramic, portions of said conductors being disposed in different layers, said method comprising preparing a plurality of dry thin films each comprising finely divided ceramic particles and a heat volatile binder therefor, forming holes at desired locations in said films, forming said conductors as thin metallic layers upon selected surface areas of at least some of said films, parts of said conductors touching the peripheries of said holes, filling said holes with a paste which comprises metallic particles in a heat volatile binder, assembling said films in a stack such that said conductors and holes are disposed in a desired relationship, and then heating said stack for a time and at a temperature sufficient to volatilize said binder and sinter said ceramic particles and said metals into a monolithic structure.

3. A method of manufacturing an electronic circuit comprising a monolithic ceramic body and interconnected electrical conductors bonded to said ceramic, portions of said conductors being disposed in different layers, said method comprising preparing a plurality of dry thin films each comprising finely divided ceramic particles and a heat volatile binder therefor, forming said conductors by silk screening a metallic paste which comprises metallic particles in a heat volatile binder, upon selected surface areas of at least some of said films, forming holes penetrating said last-mentioned films and said conductors at desired locations, filling said holes with said paste, stacking said films such that said conductors and holes in different films are superposed in desired relationship, and then heating the stack for a time and at a temperature sufficient to volatilize said binders and sinter said ceramic particles and said metals into a monolithic structure.

4. A method of manufacturing an electronic circuit comprising a monolithic ceramic body and interconnected electrical conductors bonded to said ceramic, portions of said conductors being disposed in different layers, said method comprising preparing a plurality of dry thin films each comprising finely divided ceramic particles and a heat volatile binder therefor, said ceramic comprising an aluminum oxide composition, forming said conductors by applying a paste containing a mixture of molybdenum and manganese metal particles in a heat volatile binder, upon selected areas of at least some of said films, forming holes penetrating said last-mentioned films and said conductors at desired locations, filling said holes with said paste, stacking said films to form a laminate, and then sintering the laminate to form a monolithic structure.

5. A method of manufacturing an electronic circuit comprising a monolithic ceramic body and interconnected electrical conductors bonded to said ceramic, portions of said conductors being disposed in different layers, said method comprising preparing a plurality of dry thin films each comprising finely divided ceramic particles and a heat volatile binder therefor, said ceramic particles comprising substances which form a metal titanate when reacted, forming said conductors by applying a paste containing noble metal particles in a heat volatile binder, upon selected surface areas of at least some of said films, forming holes penetrating said last-mentioned films and said conductors at desired locations, filling said holes with said paste, stacking said films to form a laminate, and then sintering said laminate to form a monolithic structure.

References Cited by the Examiner

UNITED STATES PATENTS

| | | | |
|---|---|---|---|
| 2,446,524 | 8/48 | Brennan | 156—252 |
| 2,907,925 | 10/59 | Parsons | 29—155.5 |
| 2,972,176 | 2/61 | Gravley | 25—157 |
| 2,985,709 | 5/61 | Mammola | 174—68.5 |
| 2,998,475 | 8/61 | Grimsinger | 174—68.5 |
| 3,004,197 | 10/61 | Rodriguez et al. | 156—89 |
| 3,028,656 | 4/62 | Herbert | 156—89 |
| 3,040,119 | 6/62 | Granzow | 29—155.5 |
| 3,040,213 | 6/62 | Byer et al. | 29—155.5 XR |
| 3,065,515 | 11/62 | Antes | 25—157 |
| 3,074,143 | 1/63 | Smith | 156—89 |

EARL M. BERGERT, *Primary Examiner.*

JOHN P. WILDMAN, *Examiner.*